United States Patent
Liu et al.

(10) Patent No.: US 7,802,209 B2
(45) Date of Patent: Sep. 21, 2010

(54) METHOD FOR REDUCING TIMING LIBRARIES FOR INTRA-DIE MODEL IN STATISTICAL STATIC TIMING ANALYSIS

(75) Inventors: Louis Chaochiuan Liu, Hsin-Chu (TW); Hsing-Chien Huang, Hsinchu (TW); Ssu-Chia Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 557 days.

(21) Appl. No.: 11/777,761

(22) Filed: Jul. 13, 2007

(65) Prior Publication Data
US 2009/0019409 A1    Jan. 15, 2009

(51) Int. Cl.
*G06F 17/50* (2006.01)
(52) U.S. Cl. .................... 716/2; 716/1; 716/6; 716/18
(58) Field of Classification Search ............. 716/1, 716/2, 6, 18
See application file for complete search history.

(56) References Cited

U.S. PATENT DOCUMENTS 7,453,756 B2 * 11/2008 Moyer et al. ............... 365/226

* cited by examiner

*Primary Examiner*—Thuan Do
(74) *Attorney, Agent, or Firm*—K & L Gates LLP

(57) ABSTRACT

A method for performing statistical static timing analysis on an integrated circuit (IC) is disclosed, which comprises identifying a plurality of turned-on devices in the IC during a predetermined operation of the IC, choosing only the libraries of the plurality of turned-on devices, and calculating a time delay of the IC using only the chosen libraries, wherein the number of libraries used for the time delay calculation is reduced.

17 Claims, 3 Drawing Sheets

METHOD FOR REDUCING TIMING LIBRARIES FOR INTRA-DIE MODEL IN STATISTICAL STATIC TIMING ANALYSIS

BACKGROUND

The present invention relates generally to the analysis of integrated circuits (ICs), and, more particularly, to methods for performing statistical static timing analysis on the IC.

Static timing analysis (STA) is a method of computing the expected timing of an IC without circuit simulation. High-performance ICs have traditionally been characterized by clock frequencies at which they operate. Gauging the ability of a circuit to operate at a specified speed requires an ability to measure, during the design process, its delays at numerous steps. Moreover, delay calculation must be incorporated into the inner loop of timing optimizers at various phases of design, such as logic synthesis, layout (placement and routing), and in in-place optimizations performed late in the design cycle. While such timing measurements can theoretically be performed using a rigorous circuit simulation, such an approach requires tremendous amount of calculations and would take too long to be practical. Static timing analysis uses simplified delay models to measure circuit timing with reasonable accuracies and in much shorter time. STA has an advantage that it does not require input vectors and has a run time that is linear with the size of the circuit.

Traditionally, process variations have been modeled in STA using so called corner analysis. In this methodology, best-corner, nominal and worst corner SPICE parameters sets are constructed and the timing analysis is performed several times, each time using one corner file. Each execution of STA is therefore deterministic, meaning that the analysis uses deterministic delays for the gates and any statistical variation in the underlying silicon is ignored. While this approach has been successfully used in the past to model die-to-die variations, it is not able to accurately model variations within a single die. With the continual scaling of feature sizes, the ability to control critical device parameters on a single die has become increasingly difficult. Using a worst corner analysis for these variations therefore leads to very pessimistic analysis results since it assumes that all devices on a die have worst corner characteristics, ignoring their inherent statistical variation. The emerging dominance of process variations, therefore, poses a major obstacle for deterministic STA, and gives rise to the need for statistical static timing analysis (SSTA) approaches.

In general, process variations can be divided into inter-die variations and intra-die variations. Inter-die variations are variations that occur from one die to the next, meaning that the same device on a chip has different features among different die of a wafer, from wafer to wafer, and from wafer lot to wafer lot. Intra-die variations are variations in device features that are present within a single chip, meaning that a device feature varies between different locations on the same die. Intra-die variation results from equipment limitations or statistical effects in the fabrication process, such as statistical variations in the doping concentrations.

However, comparing to conventional STA, SSTA needs to characterize more libraries to produce nominal timing entities and their sensitivities with respect to process and environmental parameters. A library is a file containing timing and logical information about a collection of circuit cells. The nominal-and-sensitivity combined timing entities are used to predict distributions of circuit performance while verifying its timing. To be specific, there are three types of libraries for the SSTA. They are nominal, shifted inter-die and shifted intra-die libraries. The shifted inter-die libraries relates to the global process variation. The shifted intra-die libraries relates to the local process variation. More libraries to be characterized will obviously take more time and disk space in the SSTA operation. The time and disk space consumption issue will become more acute when the IC under timing analysis is very large and complicated.

As such, what is desired is a method for performing SSTA on complex ICs with reduced number of libraries needed to be characterized.

SUMMARY

In view of the foregoing, the present invention provides a method for performing statistical static timing analysis on an integrated circuit (IC). The method comprises identifying a plurality of turned-on devices in the IC during a predetermined operation of the IC, choosing only the libraries of the plurality of turned-on devices, and calculating a time delay of the IC using only the chosen libraries, wherein the number of libraries used for the time delay calculation is reduced.

The construction and method of operation of the invention, however, together with additional objects and advantages thereof will be best understood from the following description of specific embodiments when read in connection with the accompanying drawings.

Figure 1:
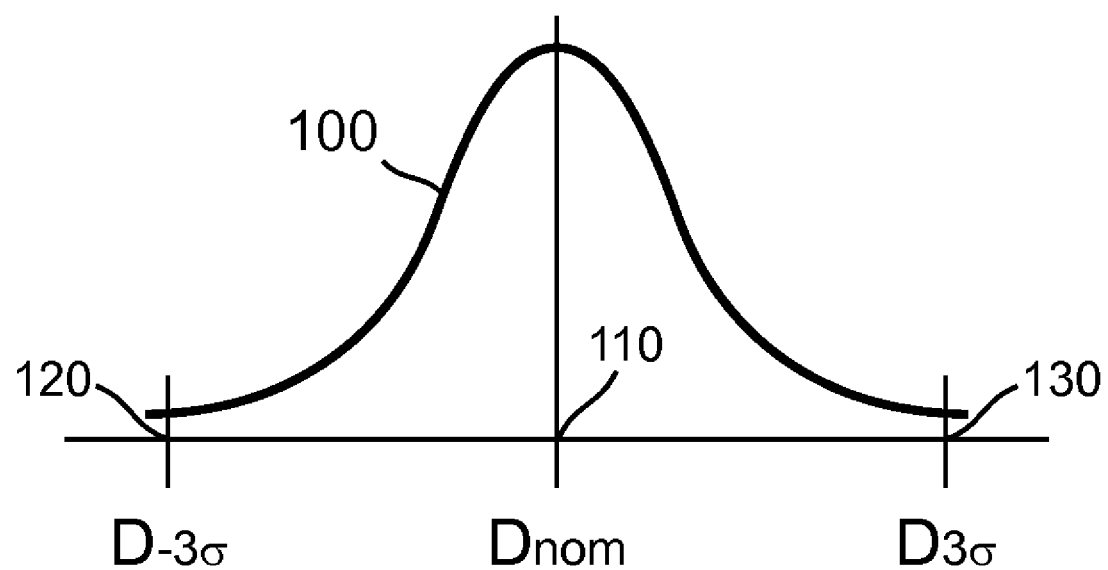
FIG. 1 shows a normal distribution of timing delays of a circuit with statistical variations.

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The following will provide a detailed description of a method for reducing timing libraries in statistical static timing analysis (SSTA) of integrated circuits (ICs).

FIG. 1 shows a normal distribution of timing delays of a circuit with statistical variations. Due to process variations, time delay for the same circuit may vary from die to die across as well as within a die. The from-die-to-die and within-a-die variations are also called global variations and local variations, respectively. Statistically, the variations have a normal distribution, i.e., a probability for a time delay D to fall at a nominal delay Dnom is the highest. At a three times the standard deviation 6, the probability is close to none. The probability has a bell shaped distribution. Assuming there are five global principle component analyses (PCAs) and five local PCAs to represent the major process parameters for a standard cell in a certain technology node, e.g., 65 nm, then the time delay, D, can be expressed as following Eq. 1:

$$D=D_{nom}+k_{g1}A_1+k_{g2}A_2+k_{g3}A_3+k_{g4}A_4+k_{g5}A_5+k_{11}B_1+k_{12}B_2+k_{13}B_3+k_{14}B_4+k_{15}B_5 \quad \text{(Eq. 1)}$$

where, $A_1 \sim A_5$ are global PCAs, $B_1 \sim B_5$ are local PCAs, $k_{g1} \sim k_{g5}$ are global sensitivities, and $k_{11} \sim k_{15}$ are local sensitivities. Then, $$\sum_{i=1}^{5} k_{gi} A_i$$

represents a sum of the global variations, and $$\sum_{i=1}^{5} k_{li} B_i$$

represents a sum of the local variations. In general, the number of libraries, N, needed for calculating the timing delay D according to Eq. 1 can be summarized as following:

$$N = H0 + H1 \cdot H_{gp} \cdot H_\sigma + H2 \cdot H_{lp} \cdot H_\sigma \quad \text{(Eq. 2)}$$

where, H0=1 for only one nominal library is needed, H1 is determined by the inter-die sensitivity, H2 is determined by the intra-die sensitivities, $H_{gp}$ is the number of global PCAs, $H_{lp}$ is the number of local PCAs, and $H_\sigma=2$ for two libraries are needed for +/−3σ, respectively. The present invention tackle the intra-die sensitivity number H2, and set H1=1, and as assumed earlier, $H_{gp}=H_{lp}=5$. The following Table 1 summarizes the values of the numbers unrelated to the present invention.

TABLE 1

| | |
|---|---|
| H0 | 1 |
| H1 | 1 |
| $H_{gp}$ | 5 |
| $H_{lp}$ | 5 |
| $H_\sigma$ | 2 |

In following paragraphs specific cells will be used to illustrate how the intra-die sensitivity number H2 is reduced and so does the number of libraries needed for calculating the timing delay D according to Eq. 1.

Figure 2:
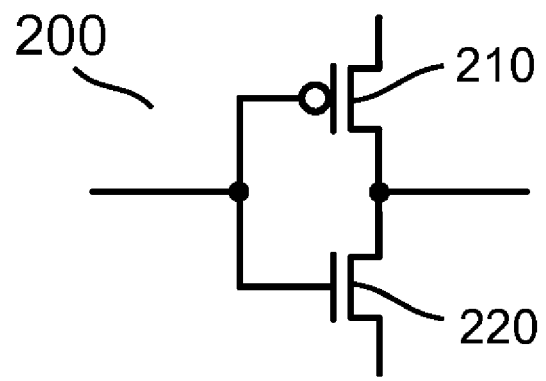
FIG. 2 is a schematic diagram of an inverter used for illustrating a library reduction method of the present invention.

FIG. 2 is a schematic diagram of an inverter 200 used for illustrating a library reduction method according to an embodiment of the present invention. The inverter 200 has two devices, a PMOS transistor 210 and a NMOS transistor 220. When an input of the inverter turns to a logic LOW state, an output of the inverter is pulled to a logic HIGH state, or the inverter 200 is in a rising operation. Conversely, when the input turns to the logic HIGH state, the output is pulled to the logic LOW state, or the inverter 200 is in a falling operation. Conventionally, both the devices 210 and 220 need to be calculated for either a rising operation or a falling operation. Therefore, the intra-die sensitivity number H2=2. Eq. 2 then yields N=31. When combining both rising and falling operations, there will be 62 libraries needed to be calculated.

Notably, during the rising operation, only the PMOS transistor 210 is turned on, and the NMOS transistor 220 is turned off, which has little or no effect in theory on the delay of the inverter 200. Therefore, the present invention proposes to calculate only the library of the "on" PMOS transistor 210, so that the intra-die sensitivity number H2=1. Eq. 2 then yields N=21 for the rising operation. For the falling operation, the intra-die sensitivity number H2 can be similarly reduced to 1 by calculating only the "on" NMOS transistor 220. Then a total number of libraries needed to be calculated according to the embodiment of the present invention becomes 42, a significant reduction from the conventional method of 62.

Figure 3:
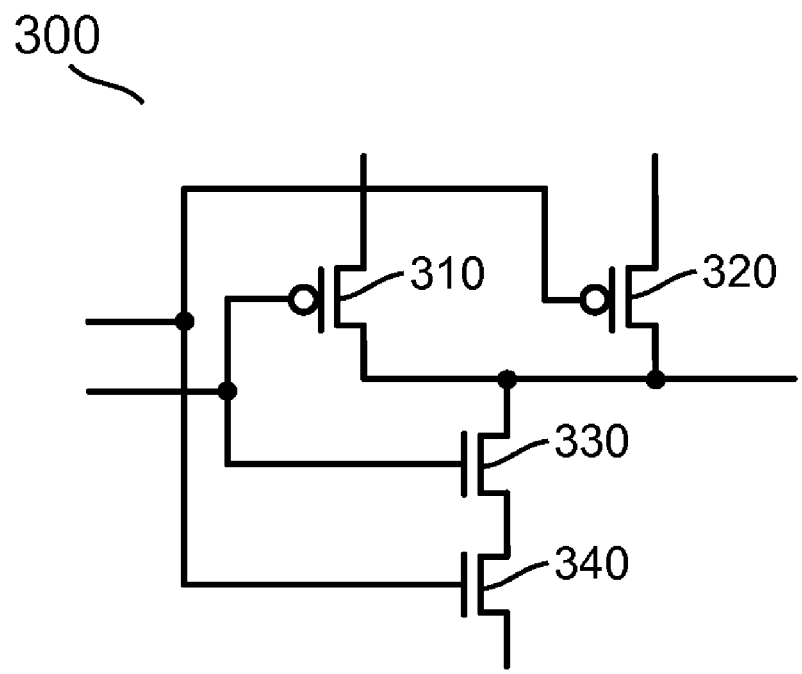
FIG. 3 is a schematic diagram of an NAND gate used for illustrating the library reduction method of the present invention.

FIG. 3 is a schematic diagram of an NAND gate 300 used for illustrating the library reduction method of the embodiment of the present invention. The NAND gate 300 has four transistors, two PMOS transistors 310 and 320 and two NMOS transistors 330 and 340. The conventional method is to calculate all four transistors for both the rising and falling operations, for which Eq. 2 yields 51 for each operation. Then a total number of libraries for the conventional method is 102.

Similar to the inverter 200, during a rising operation only one PMOS transistor 310 or 320 is "on" therefore, H2=1, and Eq. 2 yields N=21. During a falling operation, both the NMOS transistors 330 and 340 are "on", therefore, H2=2, and Eq. 2 yields N=31. Then a total number of libraries needed to be calculated according to the embodiment of the present invention becomes 52, a significant reduction from the conventional method of 102.

Figure 4:
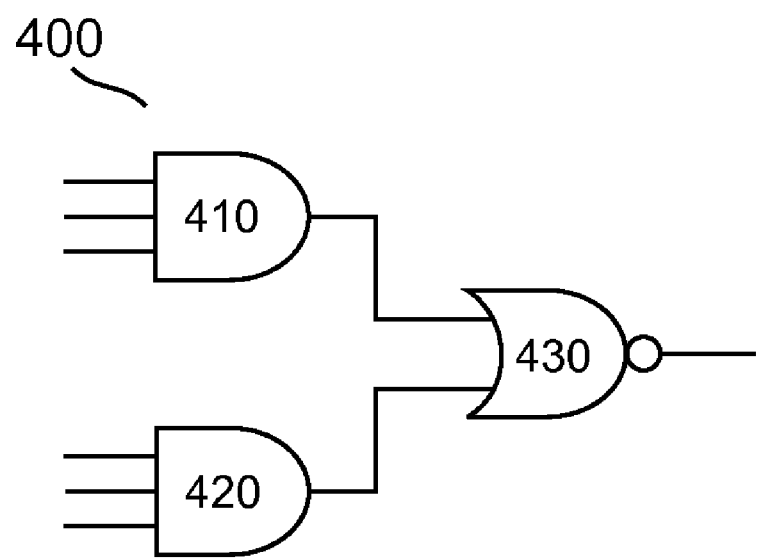
FIG. 4 is a schematic diagram of a complicated cell used for illustrating the library reduction method of the present invention.

FIG. 4 is a schematic diagram of a complicated cell 400 used for illustrating the library reduction method of the embodiment of the present invention. The complicated cell 400 is logically represented by two AND gates 410 and 420 and a NOR gate 430. It is constructed by 12 discrete transistors (not shown). A rising operation only needs one PMOS transistor (not shown) to be "on", and three transistors to be "on" for a falling operation. The conventional method requires to calculate all 12 transistors or H2=12, then Eq. 2 yields N=131 for both the rising and falling operations. But according to the embodiment of the present invention, H2=1 for the rising operation, and H2=3 for the falling operation, and Eq. 2 yields N=21 for the rising operation, and N=41 for the falling operation. A total number of libraries needed to be calculated according to the embodiment of the present invention becomes 62, a significant reduction from the conventional method of 262.

Figure 5:
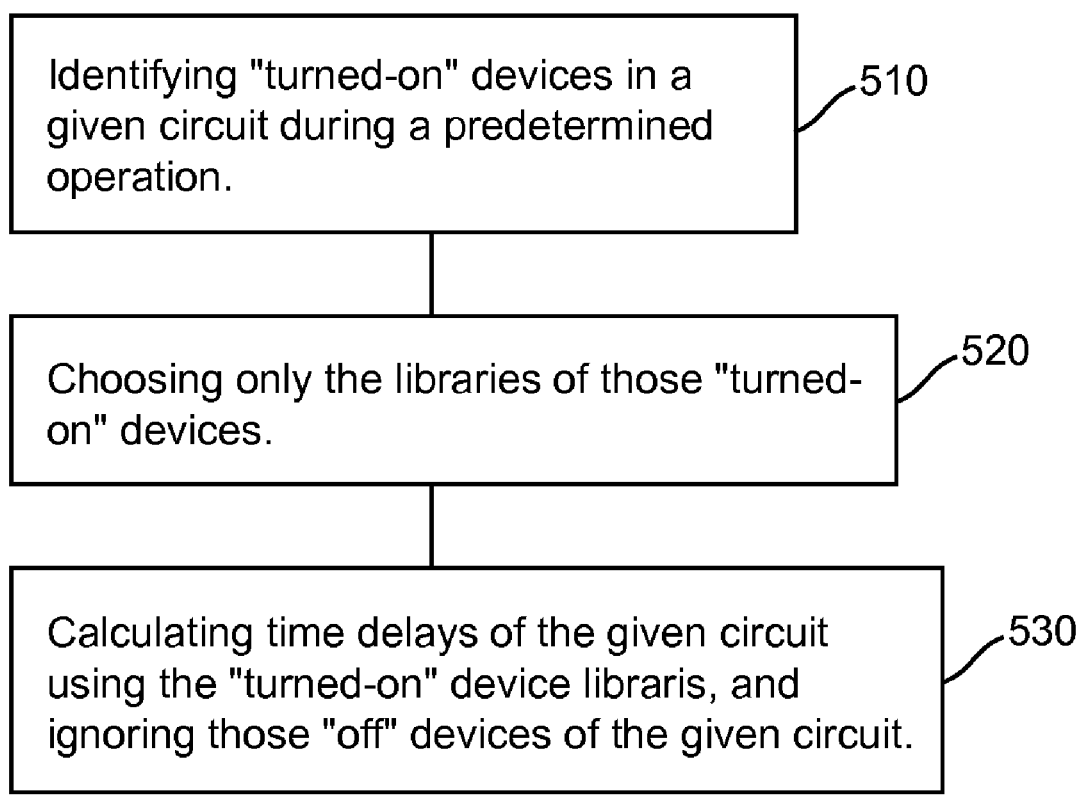
FIG. 5 is a flow chart illustrating steps of the library reduction method of the present invention.

FIG. 5 is a flow chart illustrating steps of the library reduction method of the present invention. The flow chart is a summary of the embodiment of the present invention described in the above examples. The library reduction method begins with identifying "turned-on" devices in a given circuit during a predetermined operation in step 510. The predetermined operation may be a rising or falling of an output of the given circuit. In some cases, the minimum number of turned-on devices for the predetermined operation is also identified to obtain a worst corner time delay assessment. Then only those libraries of the "turned-on" devices are chosen in step 520 to be used in a calculation of the time delay of the given circuit in step 530. Those "off" devices have very little effect on the time delay of the given circuit, therefore, they are ignored in the time delay calculation. In this way, a total number of libraries needed for the calculation may be significantly reduced. Although time delay calculation is used to describe the present invention, a skilled artisan would appreciate that the library number reduction method of the present invention may be applied to other calculations as long as a desired parameter is determined only by "turned-on" devices.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for performing static analysis on an integrated circuit (IC), the method comprising:
   identifying turned-on devices in the IC during a predetermined operation of the IC;
   choosing only libraries of the turned-on devices, wherein each of the libraries is a file containing timing and logical information on a collection of circuit cells of the IC;
   calculating at least one circuit parameter including a time delay parameter of the IC using only the chosen libraries, thereby reducing a total number of libraries needed for the calculating; and
   optimizing a circuit design of the IC by incorporating the calculating step into logic synthesis or layout phase of the circuit design of the IC.

2. The method of claim 1, wherein the static analysis is a statistical static timing analysis (SSTA).

3. The method of claim 2, wherein the SSTA reflects intra-die variations.

4. The method of claim 2, wherein the SSTA reflects inter-die variations.

5. The method of claim 1, wherein the chosen libraries contain at least timing and logic information of the turned-on devices.

6. The method of claim 1, wherein the identifying comprises identifying the least number of turned-on devices during the predetermined operation, wherein the time delay is a worst-corner.

7. A method for performing static analysis on an integrated circuit (IC), the method comprising:
   identifying turned-on devices in the IC during a predetermined operation of the IC;
   choosing only libraries of the turned-on devices, wherein each of the libraries is a file containing timing and logical information on a collection of circuit cells of the IC;
   calculating a time delay of the IC using only the chosen libraries, thereby reducing a total number of libraries needed for the calculating; and
   optimizing a circuit design of the IC by incorporating the calculating step into logic synthesis or layout phase of the circuit design of the IC.

8. The method of claim 7, wherein the static analysis is a statistical static timing analysis (SSTA).

9. The method of claim 8, wherein the chosen libraries contain at least timing and logic information of the turned-on devices.

10. The method of claim 8, wherein the SSTA reflects intra-die variations.

11. The method of claim 8, wherein the SSTA reflects inter-die variations.

12. The method of claim 7, wherein the identifying comprises identifying the least number of turned-on devices during the predetermined operation, wherein the time delay is a worst corner.

13. A method for performing static analysis on an integrated circuit (IC), the method comprising:
   identifying turned-on devices in the IC during a predetermined operation of the IC, wherein the predetermined operation yielding the worst result;
   choosing only libraries of the turned-on devices, wherein each of the libraries is a file containing timing and logical information on a collection of circuit cells of the IC;
   calculating at least one circuit parameter including a time delay parameter of the IC using only the chosen libraries, thereby reducing a total number of libraries needed for the calculating; and
   optimizing a circuit design of the IC by incorporating the calculating step into logic synthesis or layout of the collection of the circuit cells of the IC.

14. The method of claim 13, wherein the static analysis is a statistical static timing analysis (SSTA).

15. The method of claim 14, wherein the SSTA reflects intra-die variations.

16. The method of claim 14, wherein the SSTA reflects inter-die variations.

17. The method of claim 13, wherein the chosen libraries contain at least timing and logic information of the turned-on devices.

* * * * *